US 10,410,700 B1
Sep. 10, 2019

(12) United States Patent
Yadav

(54) SYSTEMS AND METHOD FOR A LOW-POWER CORRELATOR ARCHITECTURE USING SHIFTING COEFFICIENTS

(71) Applicant: The MITRE Corporation, McLean, VA (US)

(72) Inventor: Rishi Yadav, Nashua, NH (US)

(73) Assignee: The MITRE Corporation, McLean, VA (US)

( * ) Notice: Subject to any disclaimer, the term of this patent is extended or adjusted under 35 U.S.C. 154(b) by 0 days.

(21) Appl. No.: 16/146,146

(22) Filed: Sep. 28, 2018

(51) Int. Cl.
*H03H 17/06* (2006.01)
*H03H 15/00* (2006.01)
*G11C 7/22* (2006.01)

(52) U.S. Cl.
CPC ............. *G11C 7/222* (2013.01); *H03H 17/06* (2013.01); *H03H 15/00* (2013.01)

(58) Field of Classification Search
CPC ................................ G11C 7/222; H03H 17/06
USPC ........................................................ 365/194
See application file for complete search history.

(56) References Cited

U.S. PATENT DOCUMENTS

| 4,136,398 | A | | 1/1979 | Eggermont |
| 5,301,134 | A | | 4/1994 | Maruyama |
| 5,831,880 | A | | 11/1998 | Lee |
| 6,032,171 | A | * | 2/2000 | Kiriaki ................. H03H 15/00 708/316 |
| 6,035,320 | A | * | 3/2000 | Kiriaki ................. H03H 17/06 708/316 |
| 6,108,681 | A | | 8/2000 | Wittig et al. |
| 6,606,641 | B1 | | 8/2003 | Wittig et al. |
| 7,054,896 | B2 | | 5/2006 | Lee et al. |
| 7,107,301 | B2 | | 9/2006 | Rylov et al. |
| 7,164,712 | B2 | | 1/2007 | Wittig |

(Continued)

FOREIGN PATENT DOCUMENTS

| JP | 63-35023 | 2/1988 |
| KR | 10-0298127 | 5/2001 |
| KR | 2001-0091159 | 10/2001 |
| KR | 10-0335252 | 4/2002 |
| KR | 10-0746856 | 8/2007 |

OTHER PUBLICATIONS

Danne, Klaus (2004) "Distributed Arithmetic FPGA Design with Online Scalable Size and Performance," 17th Symposium on Integrated Circuits and Systems Design, Sep. 7-11, Pernambuco, Brazil; pp. 135-140.

(Continued)

*Primary Examiner* — Ly D Pham
(74) *Attorney, Agent, or Firm* — Morrison & Foerster LLP

(57) ABSTRACT

A finite impulse response (FIR) filter that implements a shifting coefficients architecture is provided. A shifting coefficients architecture can allow for the data samples being processed by the FIR filter by shifting the coefficients rather than the data. In one or more examples, the shifting coefficients architecture includes one or more delay tap lines that store data samples, and one or more shift registers that store coefficients. At every clock cycle, only the oldest data sample stored in the delay tap lines is updated with a new sample, while the other data samples remain static. Concurrently, each coefficient can be shifted by one register. Then each coefficient can be multiplied with a corresponding data sample, and the results can be aggregated to generate an FIR filter output.

21 Claims, 10 Drawing Sheets

(56) References Cited

U.S. PATENT DOCUMENTS

| | | | |
|---|---|---|---|
| 7,167,514 B2 | 1/2007 | McElroy et al. | |
| 7,289,558 B2 | 10/2007 | Bose et al. | |
| 7,565,389 B2 | 7/2009 | Runze | |
| 7,587,440 B2 | 9/2009 | Aramaki | |
| 7,917,569 B2 | 3/2011 | Bhuvanagiri et al. | |
| 8,131,790 B2 | 3/2012 | Masumoto | |
| 2001/0056450 A1* | 12/2001 | Kiriaki ................... | H03H 15/00 708/300 |

OTHER PUBLICATIONS

Grover, R.S. et al. (2002) "A Faster Distributed Arithmetic Architecture for FPGAs," ACM/SIGDA Tenth International Symposium on Field-Programmable Gate Arrays, Feb. 24-26, Monterey, California; pp. 31-39.

Hwang, Sangyun, et al. (May 2004). "New Distributed Arithmetic Algorithm for Low-Power FIR Filter Implementation," IEEE Signal Processing Letters 11(5): 463-466.

Meher, P.K. (Mar. 2010) "New Approach to Look-Up-Table Design and Memory-Based Realization of FIR Digital Filter," IEEE Transactions on Circuits and Systems I: Regular Papers 57(3): 592-603.

Mirzaei, S. et al. (2006) "FPGA Implementation of High Speed FIR Filters Using Add and Shift Method," International Conference on Computer Design, Oct. 1-4, San Jose, California; pp. 308-313.

Moeller, T.J. (1999) "Field Programmable Gate Arrays for Radar Front-End Digital Signal Processing," Doctoral dissertation, Massachusetts Institute of Technology; 116 pages.

\* cited by examiner though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

SYSTEMS AND METHOD FOR A LOW-POWER CORRELATOR ARCHITECTURE USING SHIFTING COEFFICIENTS

STATEMENT OF RIGHTS TO INVENTIONS MADE UNDER FEDERALLY SPONSORED RESEARCH

This invention was made with Government support under U.S. Government contract FA8702-18-C-0001 awarded by the U.S. Air Force Space and Missile Systems Center, Global Positioning Systems Directorate (SMC/GP). The Government has certain rights in this invention.

FIELD OF THE DISCLOSURE

This disclosure relates to systems and methods for implementing a low-power correlator architecture using shifting coefficients. These systems and methods can be used to implement a finite impulse response (FIR) filter (i.e., a correlator) with improved power consumption and smaller footprint than conventional implementations of an FIR filter.

BACKGROUND OF THE DISCLOSURE

FIR filters are commonly used in signal processing designs for signal conditioning. FIR filters receive an input signal and are generally configured to block pre-specified frequency components of the input signals. The resultant output signal from an FIR filter can be equal to the input signal with the pre-specified frequency components of the input signal removed or substantially attenuated. FIR filters are commonly employed in various signal processing applications such as communications and video/audio processing.

FIR filters are generally implemented either using analog components to filter continuous analog waveforms or digitally to filter digital (discrete) waveforms. Implementing an FIR filter in a circuit can present challenges with respect to power consumption and footprint (i.e., the amount of space taken up by the circuit). Multiple techniques have been proposed to implement digital FIR filters. The most common approach is the multiply and accumulate (MAC) approach. This approach can be derived directly from the mathematical formula representing the impulse response of the FIR filter expressed below in equation 1. However, a MAC approach to implementing an FIR filter can often require numerous switching stages, all of which in aggregate can consume a significant amount of power during the operation of the FIR filter. Furthermore, the circuitry required to implement the numerous switching stages in a conventional FIR filter can also occupy a large amount of space on a circuit board or device that includes the FIR filter.

Thus, an approach to implementing an FIR filter that requires less power and less space is desirable in order to decrease the operational costs associated with including an FIR filter in any given signal processing system.

SUMMARY OF THE DISCLOSURE

Accordingly, systems and methods for implementing an FIR filter using a shifting coefficients architecture are provided. By applying a circuit architecture that shifts the coefficients of an FIR filter while leaving the input data values substantially static from clock cycle to cycle, the number of high-power consuming components required to implement the FIR filters can be reduced, thereby reducing the amount of power consumed by the FIR filter, as well as reducing the footprint of the FIR filter.

DETAILED DESCRIPTION

Figure 1:
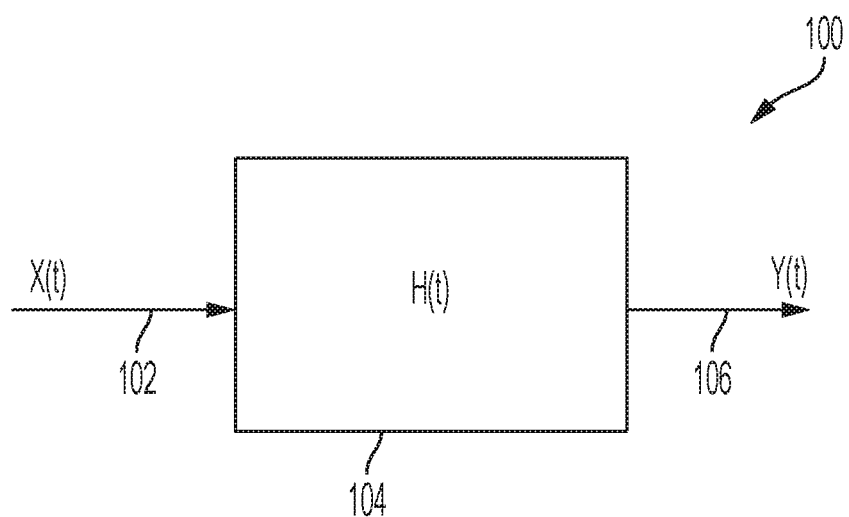
FIG. 1 illustrates an exemplary signal filter according to examples of the disclosure.

In the following description of the disclosure and embodiments, reference is made to the accompanying drawings in which are shown, by way of illustration, specific embodiments that can be practiced. It is to be understood that other embodiments and examples can be practiced and changes can be made without departing from the scope of the disclosure.

In addition, it is also to be understood that the singular forms "a," "an," and "the" used in the following description are intended to include the plural forms as well, unless the context clearly indicates otherwise. It is also to be understood that the term "and/or" as used herein refers to and encompasses any and all possible combinations of one or more of the associated listed items. It is further to be understood that the terms "includes," "including," "comprises," and/or "comprising," when used herein, specify the presence of stated features, integers, steps, operations, elements, components, and/or units but do not preclude the presence or addition of one or more other features, integers, steps, operations, elements, components, units, and/or groups thereof.

Some portions of the detailed description that follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities.

Usually, though not necessarily, these quantities take the form of electrical, magnetic, or optical signals capable of being stored, transferred, combined, compared, and otherwise manipulated. It is convenient at times, principally for reasons of common usage, to refer to these signals as bits, values, elements, symbols, characters, terms, numbers, or the like. Furthermore, it is also convenient at times to refer to certain arrangements of steps requiring physical manipulations of physical quantities as modules or code devices without loss of generality.

However, all of these and similar terms are to be associated with the appropriate physical quantities and are merely convenient labels applied to these quantities. Unless specifically stated otherwise, as apparent from the following discussion, it is appreciated that, throughout the description, discussions utilizing terms such as "processing," "computing," "calculating," "determining," "displaying," or the like refer to the action and processes of a computer system, or similar electronic computing device, that manipulates and transforms data represented as physical (electronic) quantities within the computer system memories or registers or other such information storage, transmission, or display devices.

Certain aspects of the present invention include process steps and instructions described herein in the form of an algorithm. It should be noted that the process steps and instructions of the present invention could be embodied in software, firmware, or hardware and, when embodied in software, could be downloaded to reside on and be operated from different platforms used by a variety of operating systems.

The present invention also relates to a device for performing the operations herein. This device may be specially constructed for the required purposes, or it may comprise a general-purpose computer selectively activated or reconfigured by a computer program stored in the computer. Such a computer program may be stored in a non-transitory, computer-readable storage medium, such as, but not limited to, any type of disk, including floppy disks, optical disks, CD-ROMs, magnetic-optical disks, read-only memories (ROMs), random access memories (RAMs), EPROMs, EEPROMs, magnetic or optical cards, application-specific integrated circuits (ASICs), or any type of media suitable for storing electronic instructions and each coupled to a computer system bus. Furthermore, the computers referred to in the specification may include a single processor or may be architectures employing multiple processor designs for increased computing capability.

The methods, devices, and systems described herein are not inherently related to any particular computer or other apparatus. Various general-purpose systems may also be used with programs in accordance with the teachings herein, or it may prove convenient to construct a more specialized apparatus to perform the required method steps. The required structure for a variety of these systems will appear from the description below. In addition, the present invention is not described with reference to any particular programming language. It will be appreciated that a variety of programming languages may be used to implement the teachings of the present invention as described herein.

Described herein are systems and methods for implementing a low power correlator architecture using distributed arithmetic. These systems and methods can be used to implement an FIR filter with improved power consumption and smaller footprint than conventional implementations of an FIR filter.

In the context of signal processing, filters are devices/components that can be employed in a signal processing system to remove unwanted frequency components of a given signal. FIG. 1 illustrates an exemplary signal filter according to examples of the disclosure. The example 100 of FIG. 1 illustrates a filter 104 that accepts an input 102, processes the input, and produces an output 106. In one or more examples, the input signal accepted at input 102 can have a time domain function represented by X(t).

The filter 104 can have a time domain representation expressed as H(t), and the output 106 can have a time domain representation of Y(t). The relationship between X(t) and Y(t) can be expressed by equation 1 provided below:

$$X(t)*H(t)=Y(t) \qquad (1)$$

Equation 1 above illustrates that Y(t) is a product of the time domain convolution of X(t) (i.e., the input signal) and the filter response H(t) which can alternatively be expressed in the form of equation 2 provided below:

$$\int_{-\infty}^{\infty} X(t)h(t-\tau)d\tau = Y(t) \qquad (2)$$

A convolution of two signals in the time domain can be expressed as multiplication of the two signals' frequency response. Thus, in the frequency domain, the relationship between X(t) and Y(t) can be expressed in the form of equation 3 provided below:

$$X(f)H(f)=Y(f) \qquad (3)$$

Figure 2:
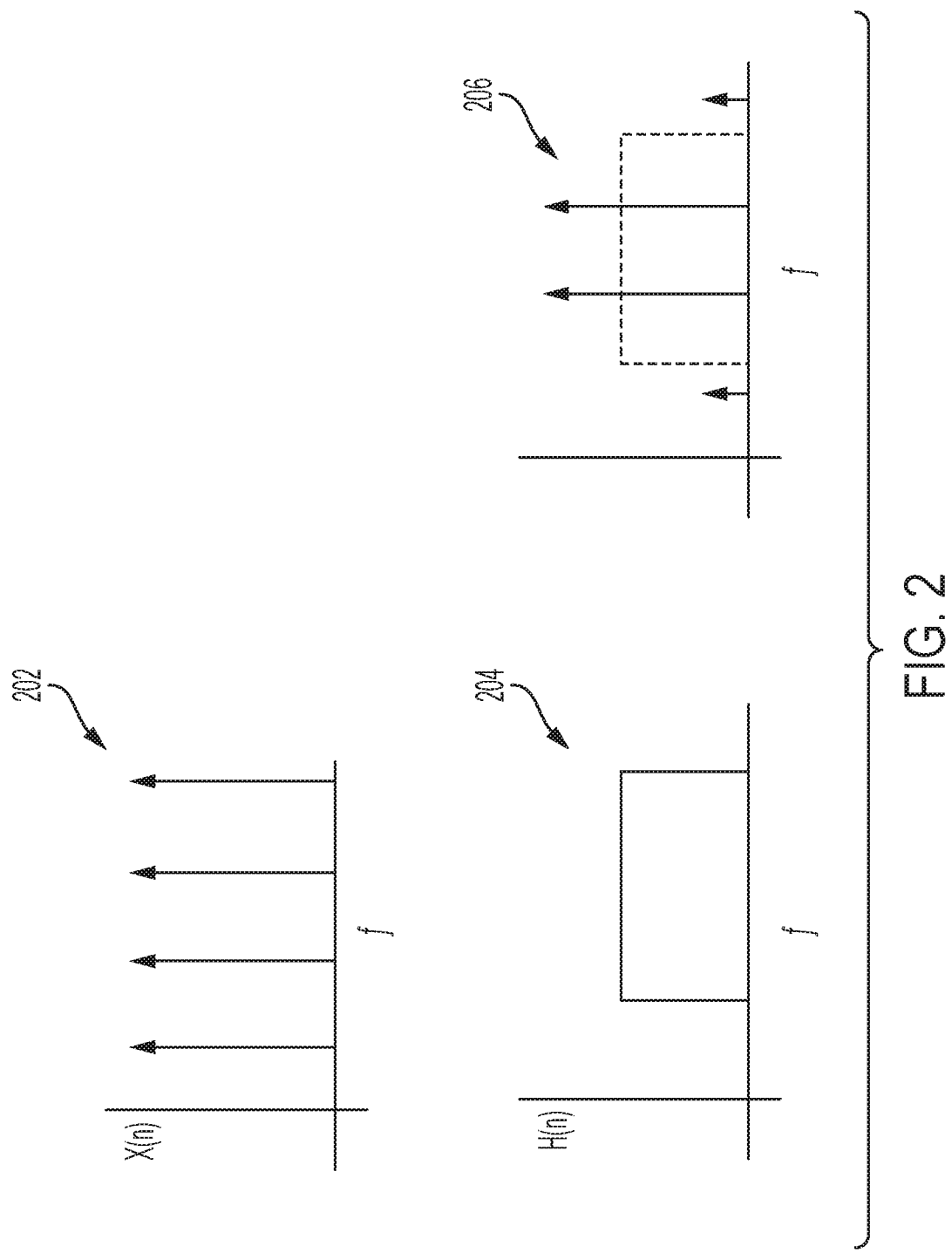
FIG. 2 illustrates exemplary frequency responses of an input signal, a filter, and an output signal according to examples of the disclosure.

Using the mathematical relationships expressed above in equations 1-3, the filter 104 can be configured to remove unwanted frequency content from an input signal (i.e., X(t)). In one or more examples, the filter 104 can be configured such that it has a frequency response that attenuates the portion of a signal containing content within a certain frequency range while allowing the portion of the signal containing content within a certain frequency range (i.e., the passband) to pass through. FIG. 2 illustrates exemplary frequency responses of an input signal, a filter, and an output signal according to examples of the disclosure. In the example of FIG. 2, the frequency response of an input signal is illustrated at graph 202, while the frequency response of a filter is illustrated at graph 204. As discussed above with respect to equation 3, the frequency response of the output signal of the filter can be the result of the multiplication of the frequency response of the input signal and the frequency response of the filter. Graph 206 can represent the frequency response of the output signal. Assuming that the frequency response of the filter is such that it attenuates any signal that is not within the passband of the filter, graph 206 illustrates that the frequency content of the signal shown in graph 202 that lies outside the frequency passband of the filter shown in graph 204 is attenuated, while the frequency content that lies within the passband is allowed to pass.

The filter and equations described above can be implemented in discrete/digital systems as well. Digital filters can be implemented using an FIR representation. An FIR filter is a filter whose impulse response eventually settles to zero, thus making the impulse response have a finite duration. An FIR filter can be expressed mathematically as a correlation, as shown in equation 4:

$$Y = \sum_{n=1}^{N} A_n \times X_n$$

Where $A_n$=L-bit wide coefficient, $X_n$=M-bit wide input data, and N=number of contiguous input samples (taps). Multiple techniques have been used to implement digital FIR filters; however, FIR filters are commonly implemented using a MAC architecture. MAC architectures compute the product of a filter coefficient and a data sample and then add the product to an accumulator. As indicated by equation 4 above, successive samples of the input $X_n$ are multiplied by a filter coefficient $A_n$, with the product being accumulated to determine the output signal Y. Since implementing digital FIR filters in the manner described above requires manipulating successive samples of an input signal X, a filter designer may choose the number of "taps" to implement the filter. An FIR tap can refer to the maximum amount of delay applied to an input signal X in order to generate the output filtered response Y. The number of taps can be an indication of the amount of memory required to implement the filter and can also indicate how many computations will be required to implement the digital filter. Selecting the number of taps with which to implement an FIR filter can include a tradeoff in which a higher number of taps may lead to improved stopband performance but may require more power and computing resources. In contrast, a lower number of taps can lead to simplicity in design and lower power consumption, but the filter may not adequately attenuate frequency content in the stopband of the filter.

An N-tap FIR implementation can require the multiplication of N consecutive data samples with their respective filter coefficients. In one or more examples, the signed bit width of data can be M bits and the signed bit width of the coefficients can be L bits. The individual multiplication results can be signed and can be L+M−1 bit wide, including the sign bit. The multiplier outputs can be added together using an adder tree. The number of adder stages required can be the rounded-up result of $\log_2$ N. Each adder stage can add 1 bit to the output. The bit width of the final untruncated result can thus be L+M−1+ceil($\log_2$ N).

Figure 3:
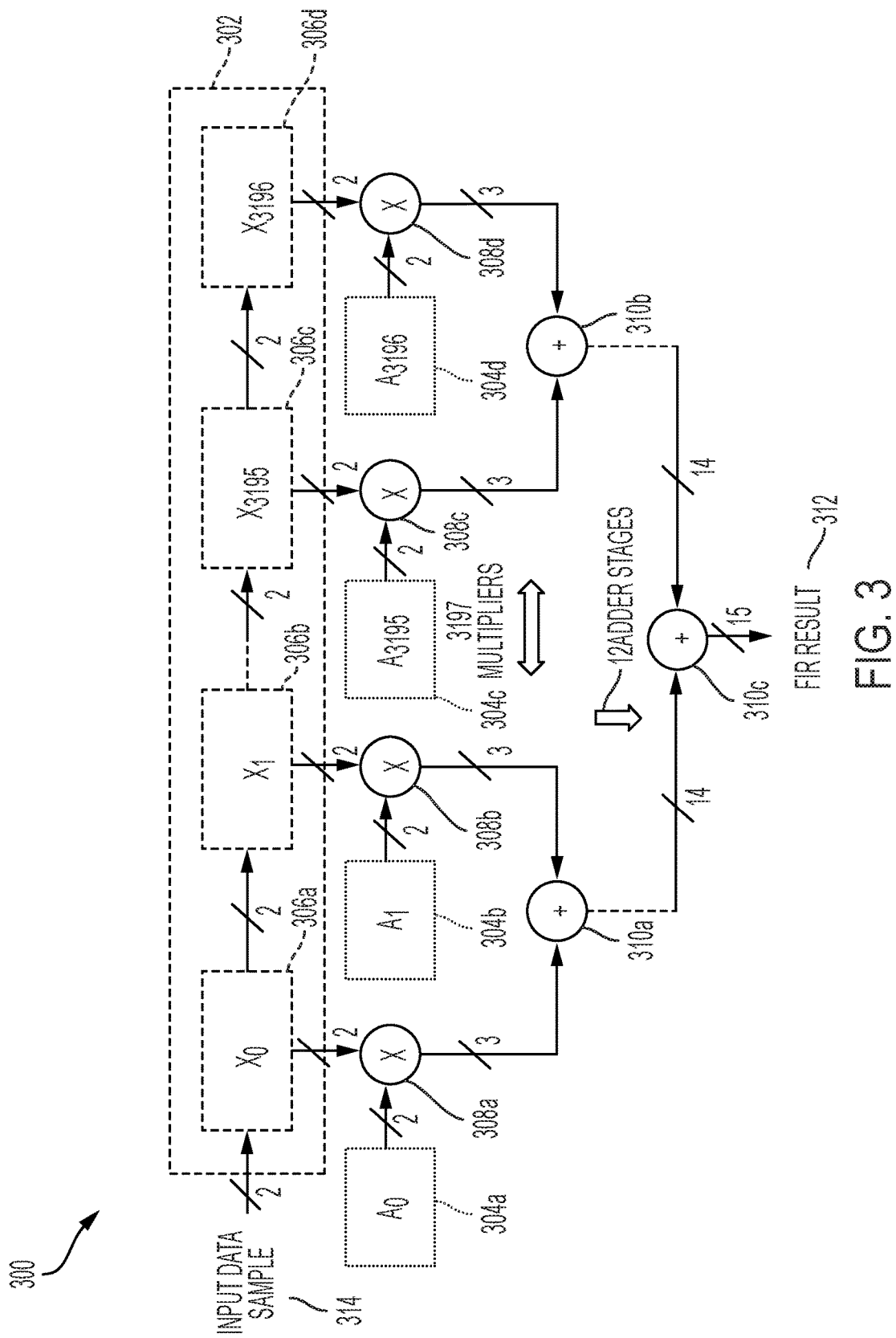
FIG. 3 illustrates an exemplary implementation of an FIR filter according to examples of the disclosure.

FIG. 3 illustrates an exemplary implementation of an FIR filter according to examples of the disclosure. The example of FIG. 3 can illustrate an exemplary implementation of an FIR filter using a MAC architecture that includes 3,197 taps. As depicted in FIG. 3, the circuit 300 used to implement the 3,197 tap FIR filter can include a shift register 302. The shift register 302 can include 3,197 delay line taps (for ease of illustration only four are shown in the figure (306a-d) which represent the first two taps and the last two taps) that can store 3,197 consecutive samples of an input data sample 314. Thus, as an example, delay line tap 306a can store the current sample that has arrived at the input 314. Delay line tap 306b can store the sample immediately before the current input sample. Delay line tap 306c can store the sample that arrived 3,196 cycles before the current input sample. Finally delay line tap 306d can store the sample that arrived 3,197 cycles before the current input sample. In this way, shift register 302 can store 3,197 contiguous (in time) samples of the input signal arriving at input 314.

Each input data sample 314 can include, in one or more examples, a plurality of bits that are used to represent each sample. In the example of FIG. 3, two bits can be used per data sample. As indicated by equation 4, an FIR filter can be applied to an input data signal by multiplying each N contiguous sample of input data with a coefficient. Thus, in the example of FIG. 3, each input data sample stored in the 3,197 delay taps (represented by 306a-d) can be multiplied by a coefficient 304a-d (which in the example of FIG. 3 can represent the 3,197 coefficients), using a series of multipliers 308a-d (which in the example of FIG. 3 can represent the 3,197 multipliers needed for the circuit 300). For example, the signal stored at tap 306a can be multiplied by a coefficient stored at 304a using multiplier 308a. The signal stored at tap 306b can be multiplied by a coefficient stored at 304b using multiplier 308b. The signal stored at tap 306c can be multiplied by a coefficient stored at 304c using multiplier 308c. Finally, the signal stored at tap 306d can be multiplied by a coefficient stored at 304d using multiplier 308d.

In the example of FIG. 3, input data sample 314 can be two bits (as discussed above), while each coefficient 304a-d can be two bits as well, therefore making the outputs of multipliers 308a-d three bits wide. Once each input sample stored in the delay tap lines 306a-d has been multiplied with its corresponding coefficient 304a-d, the results of the multiplications can be accumulated using adders 310a-c (which can represent the 12 total adder stages needed to accumulate the result the multipliers), as shown in the figure. The accumulated results from each of the adder stages can eventually yield a result 312 that is 15 bits wide, as shown in the example of FIG. 3.

The circuit depicted in FIG. 3 can consume a significant amount of power due to the complexities involved with implementing the circuit. For instance, one source of power consumption can be the amount of switching that is involved in implementing the circuit depicted in FIG. 3. The circuit 300 of FIG. 3 may be required to transfer (i.e., switch) data between the each delay tap 306a-d during each clock cycle. Thus, at each instance of time (which in one or more examples can be defined by each clock cycle), each delay tap 306a-d can switch its values to the next successive sample in the data stream. Each delay tap 306a-d can be implemented as a static and addressable register that can store a data sample according to examples of the disclosure. Thus, at each discrete instance of time during the operation of the circuit 300, each delay tap 306a-d can hold a single value of data. During each successive clock cycle, the data in one register (i.e., delay tap) can shift to the next delay tap.

Figure 4:
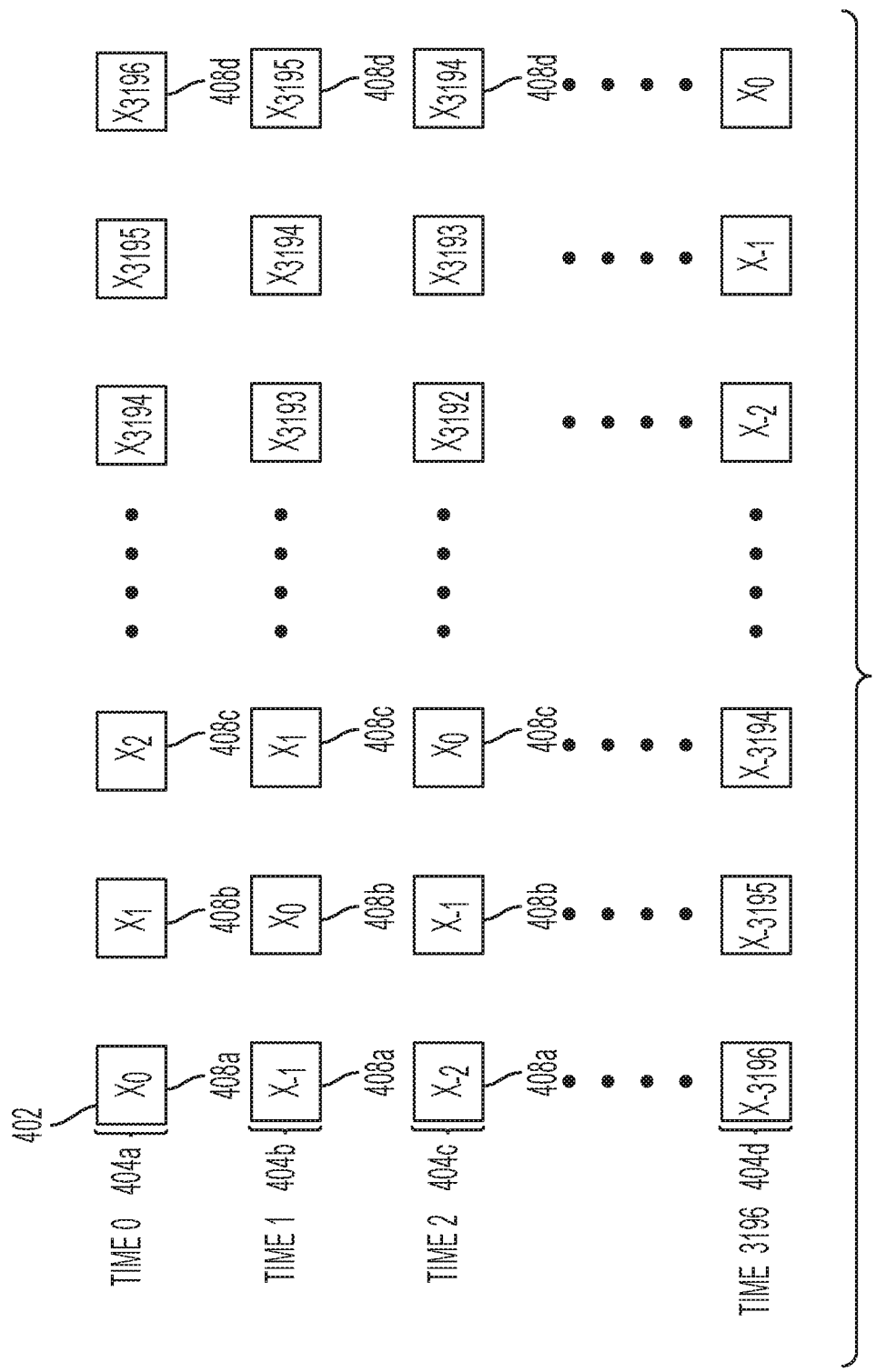
FIG. 4 illustrates an exemplary model for updating data stored in delay taps during a clock cycle according to examples of the disclosure.

FIG. 4 illustrates an exemplary model for updating data stored in delay taps during a clock cycle according to examples of the disclosure. In the example of FIG. 4, each individual box 402 can represent an individual delay tap at a specific instance of time, and each row 404a-d can represent the complete data register bank for all 3,197 delay taps 306a-d discussed above with respect to FIG. 3 at a particular instance of time. Each value located within each tap 402 can contain a specific sample of input data. For instance, at time 0 (represented by row 406a), delay tap 408a can store the most current data sample of input data "X" denoted by $X_0$ in the figure. Concurrently, delay tap 408b can hold the sample of input data "X" that was sampled at the clock cycle previous to the current clock cycle denoted by $X_1$ in the figure. Also concurrently, delay tap 408c can hold the sample of X that was acquired two samples ago denoted in the figure as $X_2$. This pattern can repeat itself all the way to delay tap 408d, which can hold the sample acquired 3,196 samples ago denoted in the figure as $X_{3196}$. The sample $X_{3196}$ stored at delay tap 408d can represent the oldest sample of data stream X stored by the delay taps 408a-d.

At the next clock cycle labeled "Time 1" in the figure and denoted by row 404b, each delay tap 408a-d can be updated.

Updating the delay taps 408a-d can include receiving a new sample of X at tap 408a denoted in the figure as $X_{-1}$ and shifting the values stored in each delay tap 408a-d one tap over. The value at tap 408d during the time period represented by row 404a (i.e., the oldest sample as described above) can be removed. Using FIG. 4 to illustrate the process of updating the taps, at Time 1 denoted by row 404b, delay tap 408b can receive a new sample of data X denoted as $X_{-1}$. The data sample $X_0$ previously held at tap 408a at time 0 (denoted by row 404a) can now be transferred to tap 408b, where it will be stored during the duration of the clock cycle. The value $X_1$ that was previously held at tap 408b at time 0 (denoted by row 404a) can now be transferred to tap 408c, where it will be stored during duration of the clock cycle. This pattern can repeated for every delay tap in the system. The final delay tap 408d can receive $X_{3195}$ from the previous tap and can subsequently erase sample $X_{3196}$ as there are no other delay taps further down the line to transfer data to. Thus, at time 1 denoted by row 404b, the sample held at delay tap 408d (i.e., $X_{3195}$) continues to store the oldest sample of X amongst the delay taps 408a-d.

During the next clock cycle (i.e., time 2) denoted by row 404c, the process can be repeated. Delay tap 408a can receive a new sample of X denoted in the figure as $X_{-2}$ and each sample stored in the delay taps 408a-d at time 1 (i.e., row 404b) can shift over by one delay tap. The value stored in delay tap 408d at time 1 can be erased and subsequently receive sample $X_{3194}$, which at time 2 can be the oldest sample stored from data stream X.

Looking ahead to time 3,196 denoted by row 404d, $X_0$, which was the newest sample of X at time 0 (denoted by row 404a), now can be stored at delay tap 408d, while the newest sample $X_{3196}$ is stored at delay tap 408a. At the next subsequent clock cycle (not pictured) all of the values stored in delay taps 408a-d at time 0 (denoted by row 404a) can be flushed out of the system.

The example of FIG. 4 can illustrate that, during the operation of the FIR filter depicted in FIG. 3, data stored in the delay taps are constantly changing during each clock cycle. This "switching" of data can constitute a significant portion of the overall power consumption of the FIR filter circuit depicted in FIG. 3. An effective method of lowering the power consumption thus can be to reduce the amount of switching in the circuit implementation. The switching component of the total power, i.e., the power consumed due to the device being active and functioning, can be directly proportional to the amount of switching in the device. For semiconductor devices, switching power can be mathematically expressed using equation 1 below:

$$P_{sw} = \alpha C V^2 f \quad (1)$$

Where, $P_{sw}$ is the switching power, $\alpha$ is the switching activity factor, C is the output capacitance driven by the transistors, V is the supply voltage, and f is the frequency of operation. In the traditional correlator architecture depicted in FIG. 3, the input sample data is shifted while the coefficients are held static in the registers. In order to reduce the power of the overall circuit, an alternative approach can be used wherein power can be reduced by treating the data register bank (i.e., the delay taps) as static and addressable, and the coefficients are shifted instead.

Figure 5:
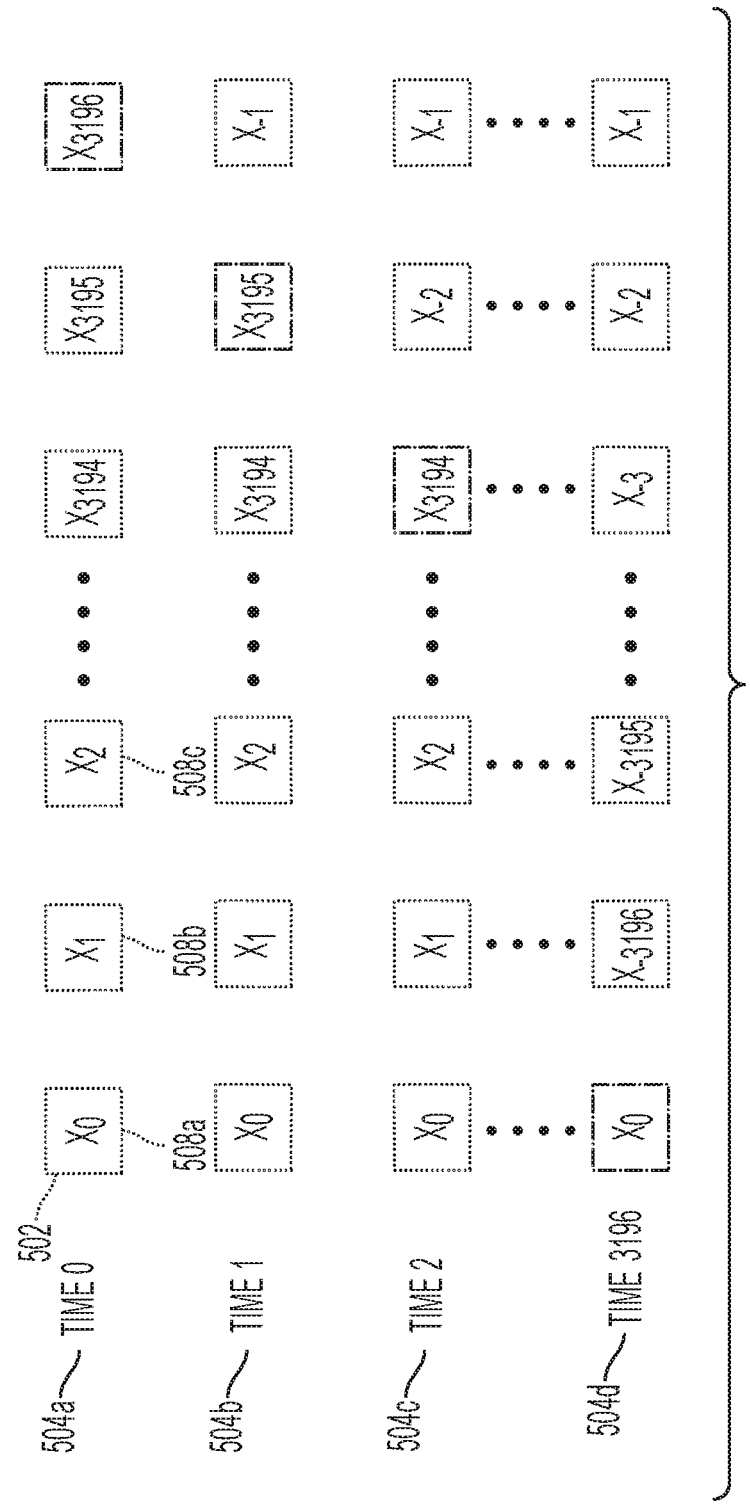
FIG. 5 illustrates an exemplary model for updating static data registers in delay taps in a shifting coefficient architecture according to examples of the disclosure.

In order to describe an FIR filter with a shifting coefficient architecture, first a discussion of how the delay taps are updated from clock cycle to cycle can help illustrate the concept underlying the architecture. FIG. 5 illustrates an exemplary model for updating static data registers in delay taps in a shifting coefficient architecture according to examples of the disclosure. The model illustrated in FIG. 5 can be structured similarly to the model described above with respect to FIG. 4. Thus, in the example of FIG. 5, each individual box 502 can represent an individual delay tap at a specific instance of time, and each row 504a-d can represent the complete data register bank for all 3,197 delay taps 506a-d similar to the example discussed above with respect to FIG. 4 at a particular instance of time.

At time 0 denoted by row 504a, the delay taps 508a-d can contain data values $X_0$ to $X_{3196}$, with $X_{3196}$ being the oldest sample and $X_0$ being the latest (similar to the example of FIG. 3). At the next sample clock (time 1, denoted by row 504b), the $X_{3196}$ sample held in delay tap 408d can be erased as it is the oldest value $X_{3196}$ (similar to the example of FIG. 4) and the delay taps 508a-d can now hold values X1 to $X_{3165}$, as shown in the figure. However, in contrast to the example of FIG. 4, other than delay tap 508d, which has changed its value, the remaining delay taps can hold their same values without any shifting. At time 2, denoted by row 504c, the $X_{3195}$ value is erased at its delay tap line and is replaced by the latest sample denoted $X_{-2}$. Thus at row 504c, the delay taps 508a-d hold samples $X_2$ to $X_{3194}$. At time 2, the only delay tap to change values is the delay tap holding the oldest value of X, while all other values held at the other delay taps are static (i.e., not changing). This pattern, wherein only the oldest sample is replaced by the newest sample while all other delay taps remain static, can repeat for every clock cycle. Thus, looking at time 3,196 denoted by row 504d, the oldest value stored in the delay taps 508a-d is $X_0$, while the newest value is $X_{-3196}$. At the next clock cycle (not pictured) the value at delay tap 508a is erased (as it is the oldest sample) and is replaced by the newest sample of X, which would be $X_{-3197}$.

The delay taps 508a-d can be implemented as a static and addressable data register bank. When implemented as a static and addressable data register bank, the write address pointer can point to the oldest value in the data register that stores input data samples. This oldest value can be updated with the latest incoming value on the next sample clock while all others can remain unchanged. This approach can reduce the switching activity to a minimum by limiting changes in the hardware components (registers) holding the input data values at any given clock cycle.

Returning to the example of FIG. 3, the contents of each delay tap line 306a-d can be multiplied with a delay coefficient 304a-d. At a subsequent clock cycle, the value stored at each delay tap can be shifted (as discussed with respect to FIG. 4) while each coefficient 304a-d remains static. However, in a shifting coefficient architecture described above, wherein the data values in each delay tap line remain static (as discussed above with respect to FIG. 4), the coefficients rather than the data can be shifted at each subsequent clock cycle.

Figure 6:
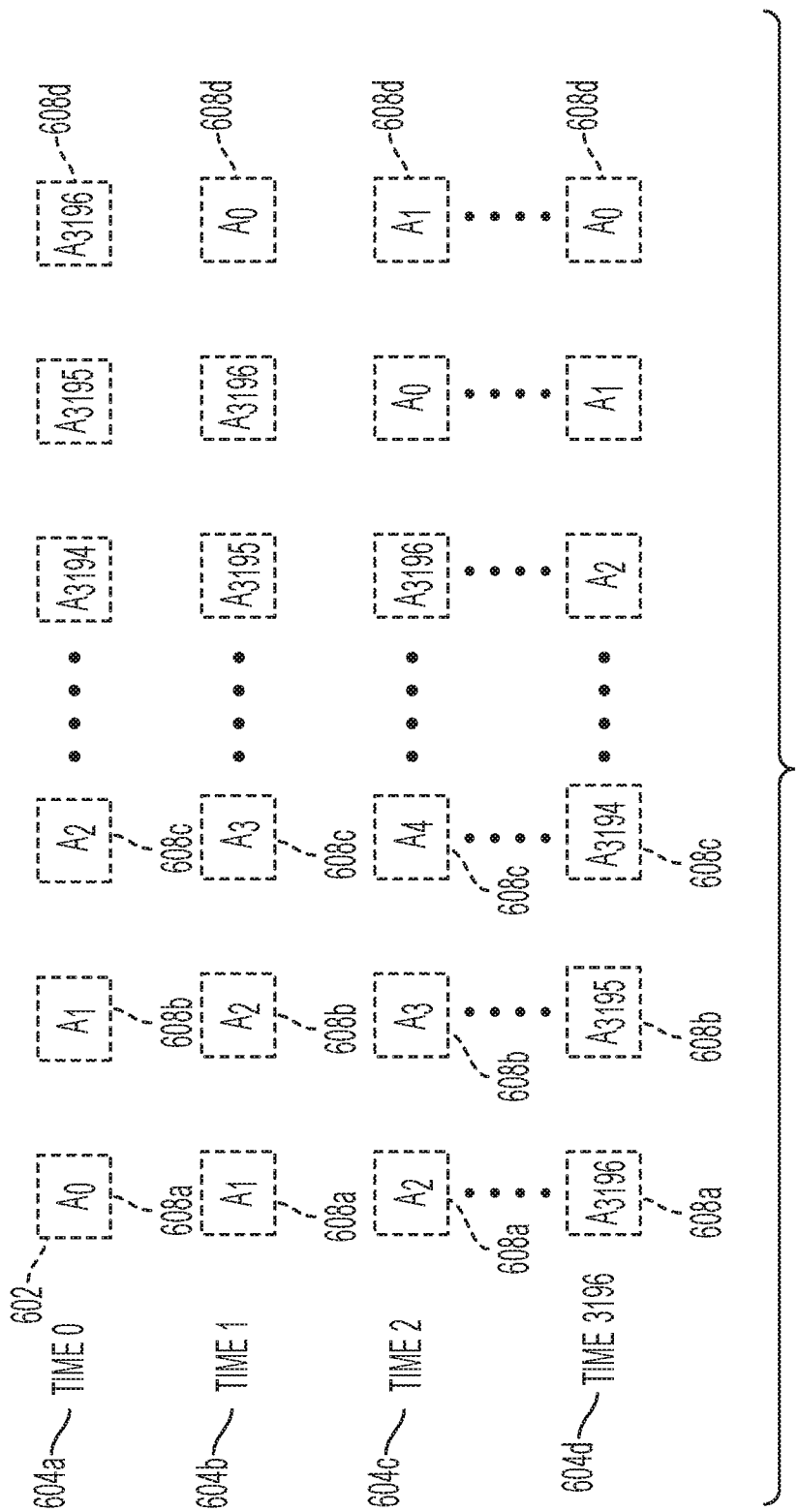
FIG. 6 illustrates an exemplary model for updating coefficients in an FIR filter implemented using a shifting coefficient architecture according to examples of the disclosure.

FIG. 6 illustrates an exemplary model for updating coefficients in an FIR filter implemented using a shifting coefficient architecture according to examples of the disclosure. In the example of FIG. 6, each block 602 can represent a coefficient register similar to the blocks 304a-d depicted in FIG. 3. Each row 604a-d can represent a clock cycle. For instance row 604a can represent time 0, 604b can represent time 1 (the clock cycle after time 0), row 604c can represent time 2 (two clock cycles after time 0), and row 604d can represent time 3,196 (3,196 clock cycles after time 0). Referring to row 604a, which can represent the clock cycle at time 0, coefficient register 608a can store the coefficient value $A_0$, register 608b can store the coefficient value $A_1$, register 608c can store the coefficient value $A_2$, and so forth up to register 608d, which can store the coefficient value $A_{3196}$.

In a shifting coefficient implementation of an FIR filter, at the next subsequent clock cycle time 1 represented by row 604b, each coefficient register can change its value to the value that was previously held in the register to its right. Thus, at row 604b (i.e., time 1) coefficient register 608a can now store the value that coefficient register 608b held at time 0 in row 604a, which as depicted in the figure is $A_1$. Likewise at time 1 (i.e., row 604b), the coefficient value held at 608b can now store the value that was previously held at coefficient register 608c at time 0 (row 604a), which as depicted in the figure is $A_2$. This pattern can repeat for each and every coefficient register 608a-d. With respect to the final coefficient register 608d, at time 1 (i.e., row 604b), the value that was previously stored at coefficient register 608a at time 0 (i.e., row 604a) can now be stored at 608d, which as depicted in the figure is the value $A_0$.

At row 604c, which can represent the next clock cycle time 2 after row 604b (i.e., time 1), coefficient register 608a can now store the value that coefficient register 608b held at time 1 in row 604b which as depicted in the figure is $A_2$. Likewise at time 2 (i.e., row 604c) the coefficient value held at 608b can now store the value that was previously held at coefficient register 608c at time 1 (row 604b), which as depicted in the figure is $A_2$. This pattern can repeat for each and every coefficient register 608a-d. With respect to the final coefficient register 608d, at time 2 (i.e., row 604c), the value that was previously stored at coefficient register 608a at time 1 (i.e., row 604b) can now be stored at 608d, which as depicted in the figure is the value $A_1$.

Looking to time 3,196 depicted at row 604d, coefficient register 608a can now store the value that coefficient register 608b held at time 3,195 (not illustrated), which as depicted in the figure is $A_{3196}$. Likewise at time 3,196 (i.e., row 604d), the coefficient value held at 608b can now store the value that was previously held at coefficient register 608c at time 3,195 (not illustrated), which as depicted in the figure is $A_{3195}$. This pattern can repeat for each and every coefficient register 608a-d. With respect to the final coefficient register 608d, at time 3,196 (i.e., row 604d), the value that was previously stored at coefficient register 608a at time 3,195 (not illustrated) can now be stored at 608d, which as depicted in the figure is the value $A_0$.

Figure 7:
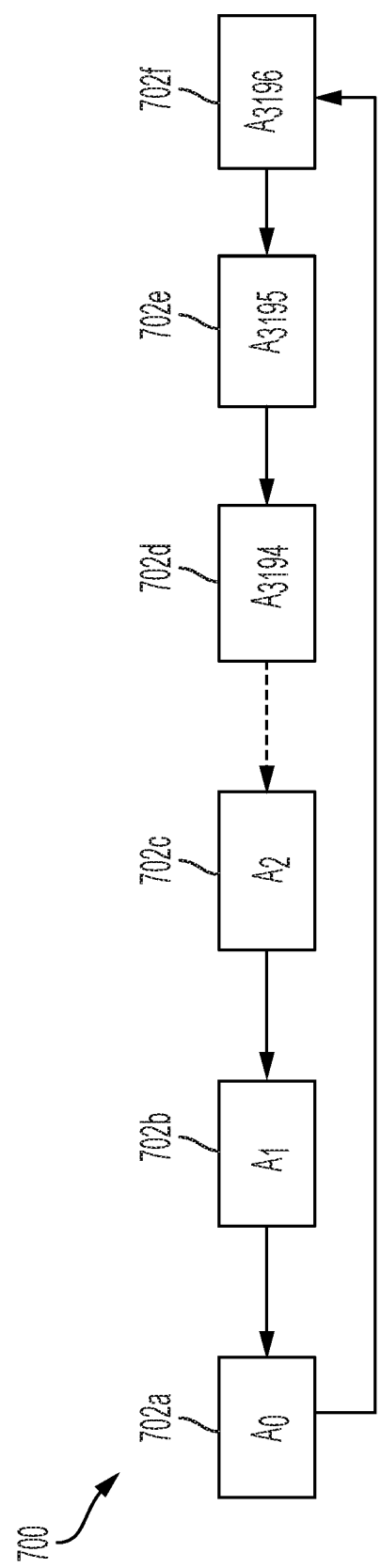
FIG. 7 illustrates an exemplary shift register implementation of the shifting coefficient model depicted in FIG. 6 according to examples of the disclosure.

The model depicted in FIG. 6 can be implemented in hardware using a shift register that shifts the coefficient one coefficient register to the left during each subsequent clock cycle. FIG. 7 illustrates an exemplary shift register implementation of the shifting coefficient model depicted in FIG. 6 according to examples of the disclosure. In the shift register 700 depicted in FIG. 7 at a first time instance, coefficient register 702a can hold value $A_0$, coefficient register 702b can hold value $A_1$, coefficient register 702c can hold $A_2$, coefficient register 702d can hold $A_{3194}$ (for convenience, the coefficient registers between 702c and 702d that hold values $A_3$-$A_{3193}$ are not illustrated), coefficient register 702e can hold $A_{3195}$, and coefficient register 702f can hold value $A_{3196}$. At the next subsequent clock cycle, each value can shift to the left, while the value stored at coefficient register 702a can be shifted to coefficient register 702f.

Looking at FIG. 5 and FIG. 6, and comparing the two, can lead to the conclusion that coefficient value $A_{3196}$ can be always multiplied with the oldest data value stored in the data registers at a particular instance of time. Also, $A_0$ can always be multiplied with the newest data value, etc. As illustrated in the model depicted in FIG. 5, what register value holds the oldest data value, and what register holds the newest data value, can change at each clock cycle; however, the coefficients can shift accordingly to ensure that $A_0$ is multiplied with the newest data while $A_{3196}$ is multiplied with the oldest data.

Figure 8A:
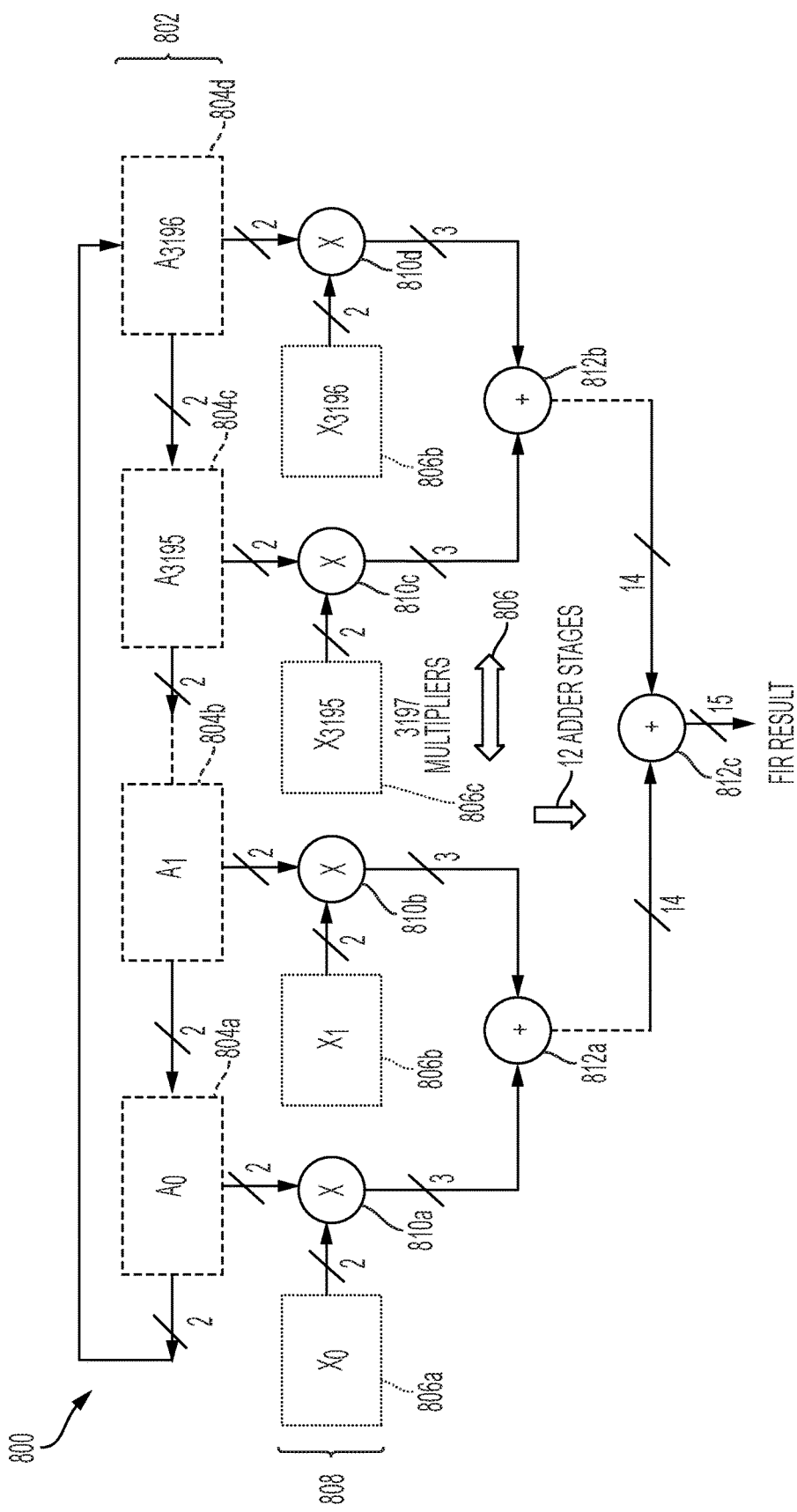
FIG. 8a illustrates an exemplary circuit implementation of an FIR filter using a shifting coefficient architecture according to examples of the disclosure.

FIG. 8a illustrates an exemplary circuit implementation of an FIR filter using a shifting coefficient architecture according to examples of the disclosure. The circuit 800 of FIG. 8a can include a coefficient shift register 802 that includes a plurality of coefficient registers 804a-d similar to the example of FIG. 7. The circuit 800 can also include a plurality of delay taps 806a-d that can be implemented as a static and addressable data register bank 808 similar to the example of FIG. 5. Each value stored in the coefficient registers 804a-d can be multiplied (using multipliers 810a-d) by its corresponding data value stored at delay taps 806a-d, as depicted in the figure. The result of each multiplication can be added together using adders 812a-c. In order to aggregate the 3,197 multiplication results, in one or more examples, 12 separate adder stages (not illustrated) can be used. Finally, the output of adder 812c can produce the final FIR result.

Figure 8B:
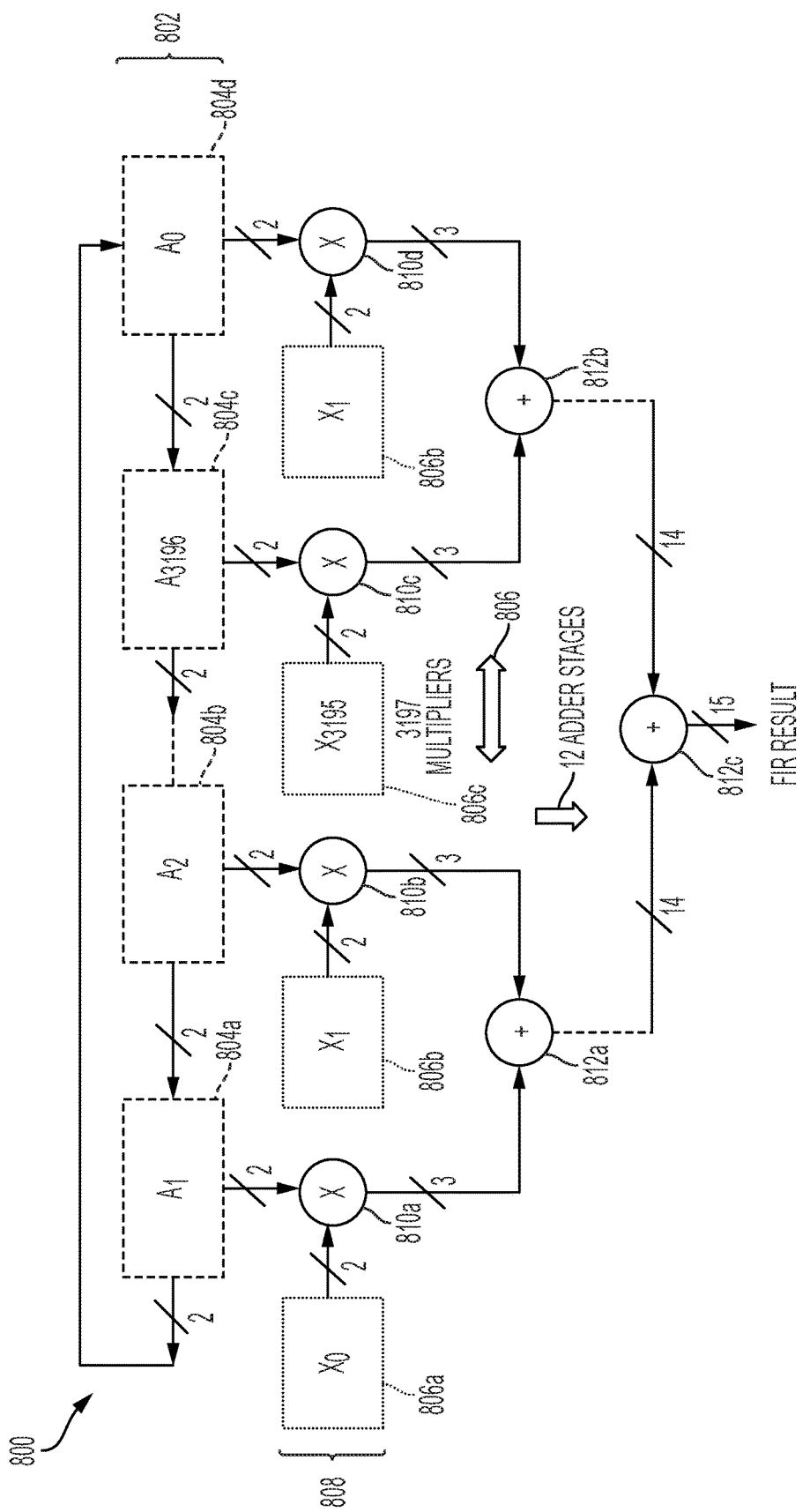
FIG. 8b illustrates the exemplary circuit implementation of an FIR filter using the shifting coefficient architecture depicted in FIG. 8a at a subsequent clock cycle according to examples of the disclosure.

FIG. 8b illustrates the exemplary circuit implementation of an FIR filter using the shifting coefficient architecture depicted in FIG. 8a at a subsequent clock cycle according to examples of the disclosure. The example of FIG. 8b can represent the same circuit of FIG. 8s at the next clock cycle. Thus, all of the values stored in delay taps 806a-d and coefficient registers 804a-d can be changed in accordance with the models discussed with respect to FIGS. 5 and 6. With respect to the delay taps 806a-d, in the circuit of FIG. 8a (i.e., time 0) delay tap 806d can hold the oldest sample of data X, denoted as $X_{3196}$. As shown in FIG. 8b, delay tap 806d can now store the newest sample of data X, denoted as $X_{-1}$ in accordance with the model depicted in FIG. 5.

With respect to the coefficient registers 804a-d, the values stored at time 0 as depicted in FIG. 8a can shift to the left, and the value stored at coefficient register 804a in FIG. 8a, can now move to coefficient register 804d in FIG. 8b. The coefficients are multiplied with their corresponding delay taps and aggregated together in the same manner as discussed above with respect to FIG. 8a.

The circuits depicted in FIGS. 8a and 8b can realize instant power savings over a conventional approach to implementing an FIR filter. For instance, in an example where the coefficients are only two bits, while the data samples are eight bits, rather than having to shift eight bits at each register during each clock cycle, it can be easier to shift only two bits per coefficient register per clock cycle. This reduction in the amount of information that needs to be shifted during each clock cycle can realize significant power savings.

Table 1 below illustrates the area and power comparison of the traditional shifting data architecture with the shifting coefficient architecture. The FIR filter's math logic is identical (Distributed Arithmetic-based) between the two designs compared. All synthesis data can assume 25% switching activity at the non-clock inputs to estimate the design's dynamic power.

TABLE 1

|  | Cell Area | Dynamic Power |
| --- | --- | --- |
| Shifting Data | 37627 µm² | 515 µW |
| Shifting Coefficient | 40990 µm² | 127 µW |
| SAVINGS % | −8.9 | +75.3 |

As shown in the table above, a shifting coefficient architecture can engender approximately 9% savings in area, and a 75% savings in power. These power savings can be greater in situations in which the data samples contain more bits than each coefficient. For instance a FIR implementation that inputs 8 bits per data sample, while utilizing two bits per coefficient can realize significant power savings by shifting the coefficients rather than the data, since doing so can require less switching as compared to conventional data shifting architectures.

One major consideration for the data register bank 808 is the address generation method. If not handled properly, the switching activity in the address generation can eat into the savings of the shifting coefficient architecture. While many address generation techniques can be employed to implement the data register bank 808, the following address generation techniques were tested for power efficiency:

Address Counter: A simple ceil($\log_2$ N) bit down-counter can be implemented to generate the address, where N is the number of taps in each data register bank. This can followed by the address decode logic. Based on the technology node, it may be advisable to implement some of the decoding logic common to all data registers while incorporating the last few stages within each data register.

One-hot Shift Register: An N-bit shift register with all but one bit as 0. The output of the shift register can be a completely decoded address. The switching can be significantly reduced in the combinational logic as no decoding may be required. Only two bits can change every clock, one from logic 1 to 0 and the other from logic 0 to 1. The downside is that the clock network load can be increased as the shift register can be larger than the counter. For a 3,197 tap data register bank, the address counter can be just 12 bits while the shift register can be 3,197 bits. However, if there are 16 8-bit wide registers (due to four separate data streams as an example) in the bank, and assuming each bit requires a flip-flop, then the total number of flip flops in the data registers can be 16*8*the number of delay taps. In the example where there are 3197 delay taps, this can mean there are approximately 409,216. Thus, the one-hot shift registers can add only 1% additional load on the clock network.

In one or more examples of the disclosure, latches can be employed to implement the delay tap lines. Latches are level-sensitive sequential elements while the flip-flops are edge-sensitive. They are also roughly half the size of equivalent flip-flops with nearly half the transistors. Flip-flops are just two latches in a master-slave combination. This property of latches makes them suitable for low-power design. The biggest disadvantage of latches is that their operation is less intuitive than flip-flops and their inclusion in a design complicates the timing/functional analysis. This drawback of latches has been addressed to a significant extent by the improvement in modern digital design tools, simplifying the analysis and verification.

Latches by themselves are not efficient in shifting data and, thus, in one or more examples, flip-flops can be used to assist the latches in shifting data. However, latches can be a good fit for storing static data (for instance, latches are commonly used as the building blocks of SRAM (Static Random Access Memory)). Since the data registers can be static and addressable in the shifting coefficient architecture, the sequential elements in those registers can be implemented as latches. Using latches to implement the data registers can cut the size of 3,197*2*4 (taps*bits*streams) sequential elements in each data register to use half the transistors of what would have been needed for the traditional data shifting architecture. Using latches in data registers can help the shifting coefficient architecture to recover the area overhead needed to make the data registers addressable.

In one or more examples, the FIR filter described in the examples above may need to be configured to handle interleaved data streams. Thus, in or more example the product terms from odd and even samples can be handled separately. While in the data shifting examples provided above, this can simply be handled by shifting the data. The shifting coefficients examples described above can be configured to also handle examples in which data streams are interleaved. Table 2 below illustrates how the odd and even samples are aggregated at 3 time steps in a shifting coefficient architecture. Of note in the table provided below is the swap between even and odd samples at every alternate cycle for the coefficient shifting architecture. The results match can produce the same results as in the data shifting architecture. For instance at time 0, the results of both architectures are identical. However at time one, there is a swap, and the even samples in the coefficient shifting example can produce the same result as the odd samples in the data shifting example. Likewise the odd samples in the coefficient shifting example can produce the same result as the even samples in the data shifting example. This manifests directly from the coefficients moving instead of staying put as in the data shifting architecture. In order to get the correct function, the results of even and odd samples are swapped every alternate cycle. Thus, the table below illustrates that the coefficient shifting architecture described in the examples above can be robust enough to handle different data formats and input data situations, while still producing the same results as the conventional data shifting architectures.

TABLE 2

| | Data Shifting | | Coefficient Shifting | |
|---|---|---|---|---|
| | Even Samples | Odd Samples | Even Samples | Odd Samples |
| Time 0 | $A_0X_0 + A_2X_{-2} + A_4X_{-4}$ | $A_1X_{-1} + A_3X_{-3} + A_5X_{-5}$ | $A_0X_0 + A_2X_{-2} + A_4X_{-4}$ | $A_1X_{-1} + A_3X_{-3} + A_5X_{-5}$ |
| Time 1 | $A_0X_1 + A_2X_{-1} + A_4X_{-3}$ | $A_1X_0 + A_3X_{-2} + A_5X_{-4}$ | $A_1X_0 + A_3X_{-2} + A_5X_{-4}$ | $A_0X_1 + A_2X_{-1} + A_4X_{-3}$ |
| Time 2 | $A_0X_2 + A_2X_0 + A_4X_{-2}$ | $A_1X_1 + A_3X_{-1} + A_5X_{-3}$ | $A_0X_2 + A_2X_0 + A_4X_{-2}$ | $A_1X_1 + A_3X_{-1} + A_5X_{-3}$ |

Figure 9:
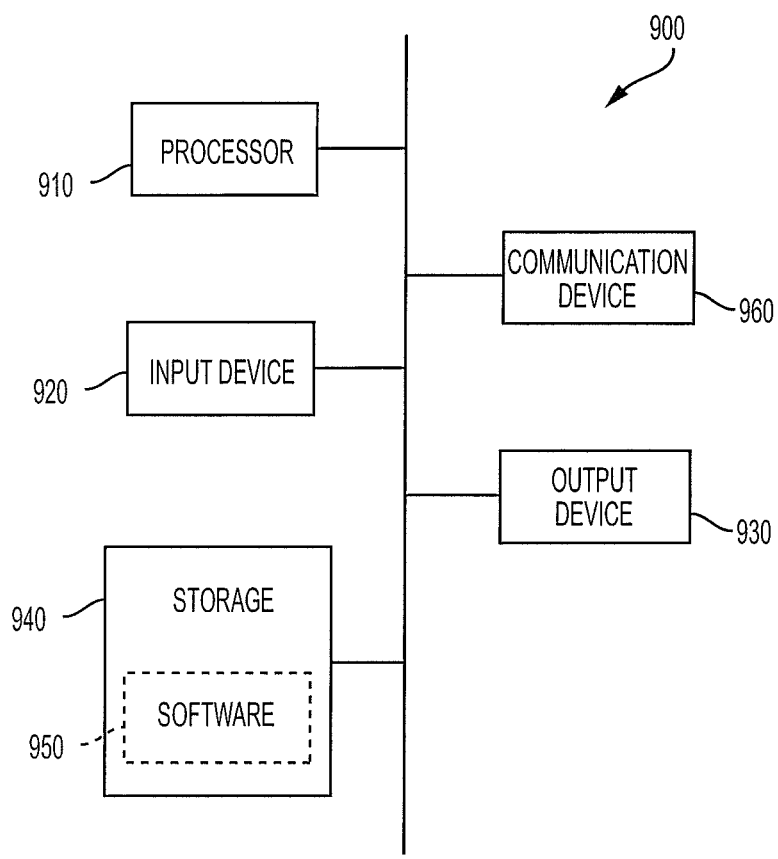
FIG. 9 illustrates an example of a computing device according to examples of the disclosure.

FIG. 9 illustrates an example of a computing device according to examples of the disclosure. Device 900 can be a host computer connected to a network. Device 900 can be a client computer or a server. As shown in FIG. 9, device 900 can be any suitable type of microprocessor-based device, such as a personal computer, workstation, server, or handheld computing device (portable electronic device) such as a phone or tablet. The device can include, for example, one or more of processor 910, input device 920, output device 930, storage 940, and communication device 960. Input device 920 and output device 930 can generally correspond to those described above and can either be connectable or integrated with the computer.

Input device 920 can be any suitable device that provides input, such as a touch screen, keyboard or keypad, mouse, or voice-recognition device. Output device 930 can be any suitable device that provides output, such as a touch screen, haptics device, or speaker.

Storage 940 can be any suitable device that provides storage, such as an electrical, magnetic, or optical memory, including a RAM, cache, hard drive, or removable storage disk. Communication device 960 can include any suitable device capable of transmitting and receiving signals over a network, such as a network interface chip or device. The components of the computer can be connected in any suitable manner, such as via a physical bus or wirelessly.

Software 950, which can be stored in storage 940 and executed by processor 910, can include, for example, the programming that embodies the functionality of the present disclosure (e.g., as embodied in the devices as described above).

Software 950 can also be stored and/or transported within any non-transitory computer-readable storage medium for use by or in connection with an instruction execution system, apparatus, or device, such as those described above, that can fetch instructions associated with the software from the instruction execution system, apparatus, or device and execute the instructions. In the context of this disclosure, a computer-readable storage medium can be any medium, such as storage 940, that can contain or store programming for use by or in connection with an instruction execution system, apparatus, or device.

Software 950 can also be propagated within any transport medium for use by or in connection with an instruction execution system, apparatus, or device, such as those described above, that can fetch instructions associated with the software from the instruction execution system, apparatus, or device and execute the instructions. In the context of this disclosure, a transport medium can be any medium that can communicate, propagate, or transport programming for use by or in connection with an instruction execution system, apparatus, or device. The transport readable medium can include, but is not limited to, an electronic, magnetic, optical, electromagnetic, or infrared wired or wireless propagation medium.

Device 900 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, T1 or T3 lines, cable networks, DSL, or telephone lines.

Device 900 can implement any operating system suitable for operating on the network. Software 950 can be written in any suitable programming language, such as C, C++, Java, or Python. In various embodiments, application software embodying the functionality of the present disclosure can be deployed in different configurations, such as in a client/server arrangement or through a Web browser as a Web-based application or Web service, for example.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims.

This application discloses several numerical ranges in the text and figures. The numerical ranges disclosed inherently support any range or value within the disclosed numerical ranges, including the endpoints, even though a precise range limitation is not stated verbatim in the specification because this disclosure can be practiced throughout the disclosed numerical ranges.

The above description is presented to enable a person skilled in the art to make and use the disclosure and is provided in the context of a particular application and its requirements. Various modifications to the preferred embodiments will be readily apparent to those skilled in the art, and the generic principles defined herein may be applied to other embodiments and applications without departing from the spirit and scope of the disclosure. Thus, this disclosure is not intended to be limited to the embodiments shown, but is to be accorded the widest scope consistent with the principles and features disclosed herein. Finally, the entire disclosure of the patents and publications referred in this application are hereby incorporated herein by reference.

What is claimed is:

1. An electronic device for implementing a finite impulse response filter, the device comprising:
 a plurality of delay taps, wherein each delay tap of the plurality of delay taps is configured to store a sample of data, wherein each stored data sample is acquired at a different time, and wherein the samples of data are acquired from a data source;
 a plurality of coefficient registers, wherein each coefficient register of the plurality of coefficient registers is configured to store a coefficient associated with the finite impulse response filter;
 a memory;
 one or more processors; and
 one or more programs, wherein the one or more programs are stored in the memory and configured to be executed by the one or more processors, the one or more programs when executed by the one or more processors cause the processor to:
  during a first clock cycle, multiply the sample of data stored in each delay tap of the plurality of delay taps with a corresponding coefficient stored in each coefficient register of the plurality of coefficient registers;
  during a second clock cycle:
   shift each coefficient stored in each coefficient register of the plurality of coefficient registers to a different coefficient register of the plurality of coefficient registers;
   determine the delay tap of the plurality of delay taps that is storing the oldest acquired data sample in time;
   acquire a new sample of data from the data source;

replace the sample stored in the delay tap determined to be storing the oldest acquired data sample in time with the newly acquired sample of data from the data source; and multiply the sample of data stored in each delay tap of the plurality of delay taps with a corresponding coefficient stored in each coefficient register of the plurality of coefficient registers.

2. The device of claim 1, wherein the coefficients associated with the finite impulse response filter are based on a desired frequency response for the finite impulse response filter.

3. The device of claim 1, wherein the plurality of delay taps are implemented using one or more latches.

4. The device of claim 1, wherein the processor is further caused to:

during a third clock cycle:
shift each coefficient stored in each coefficient register of the plurality of coefficient registers to a different coefficient register of the plurality of coefficient registers;

determine the delay tap of the plurality of delay taps that is storing the oldest acquired data sample in time;

acquire a new sample of data from the data source;

replace the sample stored in the delay tap determined to be storing the oldest acquired data sample in time with the newly acquired sample of data from the data source; and multiply the sample of data stored in each delay tap of the plurality of delay taps with a corresponding coefficient stored in each coefficient register of the plurality of coefficient registers.

5. The device of claim 1, wherein the plurality of delay taps are implemented using a plurality of data registers, and wherein each data register of the plurality of registers is static and addressable.

6. The device of claim 5, wherein the processor is further caused to generate an address and then use the generated address to replace the sample stored in the delay tap determined to be storing the oldest acquired data sample in time with the newly acquired sample of data from the data source during the first and second clock cycles.

7. The device of claim 6, wherein generating an address is implemented using a shift register with a plurality of registers, wherein all but one register of the plurality of registers store a value of 0, and one register of the plurality of registers stores a 1.

8. A method for implementing a finite impulse response filter, the method comprising:

storing a plurality of data samples at a plurality of delay taps, wherein each delay tap of the plurality of delay taps is configured to store a sample of data of plurality of data samples, wherein each stored data sample is acquired at a different time, and wherein the samples of data are acquired from a data source;

storing a plurality of coefficients associated with the finite impulse response filter at a plurality of coefficient registers, wherein each coefficient register of the plurality of coefficient registers is configured to store a coefficient of the plurality of coefficients;

during a first clock cycle, multiply the sample of data stored in each delay tap of the plurality of delay taps with a corresponding coefficient stored in each coefficient register of the plurality of coefficient registers;

during a second clock cycle:
shifting each coefficient stored in each coefficient register of the plurality of coefficient registers to a different coefficient register of the plurality of coefficient registers;

determining the delay tap of the plurality of delay taps that is storing the oldest acquired data sample in time;

acquiring a new sample of data from the data source;

replacing the sample stored in the delay tap determined to be storing the oldest acquired data sample in time with the newly acquired sample of data from the data source; and multiplying the sample of data stored in each delay tap of the plurality of delay taps with a corresponding coefficient stored in each coefficient register of the plurality of coefficient registers.

9. The method of claim 8, wherein the coefficients associated with the finite impulse response filter are based on a desired frequency response for the finite impulse response filter.

10. The method of claim 8, wherein the plurality of delay taps are implemented using one or more latches.

11. The method of claim 8, wherein the method further comprises:

during a third clock cycle:
shifting each coefficient stored in each coefficient register of the plurality of coefficient registers to a different coefficient register of the plurality of coefficient registers;

determining the delay tap of the plurality of delay taps that is storing the oldest acquired data sample in time;

acquiring a new sample of data from the data source;

replacing the sample stored in the delay tap determined to be storing the oldest acquired data sample in time with the newly acquired sample of data from the data source; and multiplying the sample of data stored in each delay tap of the plurality of delay taps with a corresponding coefficient stored in each coefficient register of the plurality of coefficient registers.

12. The method of claim 8, wherein the plurality of delay taps are implemented using a plurality of data registers, and wherein each data register of the plurality of registers is static and addressable.

13. The method of claim 12, wherein the processor is further caused to generate an address and then use the generated address to replace the sample stored in the delay tap determined to be storing the oldest acquired data sample in time with the newly acquired sample of data from the data source during the first and second clock cycles.

14. The device of claim 13, wherein generating an address is implemented using a shift register with a plurality of registers, wherein all but one register of the plurality of registers store a value of 0, and one register of the plurality of registers stores a 1.

15. A non-transitory computer readable storage medium storing one or more programs, the one or more programs comprising instructions for implementing a finite impulse response filter executed by a portable electronic device, cause the portable electronic device to:

store a plurality of data samples at a plurality of delay taps, wherein each delay tap of the plurality of delay taps is configured to store a sample of data of plurality of data samples, wherein each stored data sample is acquired at a different time, and wherein the samples of data are acquired from a data source;

store a plurality of coefficients associated with the finite impulse response filter at a plurality of coefficient registers, wherein each coefficient register of the plurality of coefficient registers is configured to store a coefficient of the plurality of coefficients;

during a first clock cycle, multiply the sample of data stored in each delay tap of the plurality of delay taps with a corresponding coefficient stored in each coefficient register of the plurality of coefficient registers;

during a second clock cycle:
  shift each coefficient stored in each coefficient register of the plurality of coefficient registers to a different coefficient register of the plurality of coefficient registers;
  determine the delay tap of the plurality of delay taps that is storing the oldest acquired data sample in time;
  acquire a new sample of data from the data source;
  replace the sample stored in the delay tap determined to be storing the oldest acquired data sample in time with the newly acquired sample of data from the data source; and
  multiply the sample of data stored in each delay tap of the plurality of delay taps with a corresponding coefficient stored in each coefficient register of the plurality of coefficient registers.

16. The non-transitory computer readable storage medium of claim 15, wherein the coefficients associated with the finite impulse response filter are based on a desired frequency response for the finite impulse response filter.

17. The non-transitory computer readable storage medium of claim 15, wherein the plurality of delay taps are implemented using one or more latches.

18. The non-transitory computer readable storage medium of claim 15, wherein the device is further caused to:

during a third clock cycle:
  shift each coefficient stored in each coefficient register of the plurality of coefficient registers to a different coefficient register of the plurality of coefficient registers;
  determine the delay tap of the plurality of delay taps that is storing the oldest acquired data sample in time;
  acquire a new sample of data from the data source;
  replace the sample stored in the delay tap determined to be storing the oldest acquired data sample in time with the newly acquired sample of data from the data source; and
  multiply the sample of data stored in each delay tap of the plurality of delay taps with a corresponding coefficient stored in each coefficient register of the plurality of coefficient registers.

19. The non-transitory computer readable storage medium of claim 15, wherein the plurality of delay taps are implemented using a a plurality of data registers, and wherein each data register of the plurality of registers is static and addressable.

20. The non-transitory computer readable storage medium of claim 19, wherein the processor is further caused to generate an address and then use the generated address to replace the sample stored in the delay tap determined to be storing the oldest acquired data sample in time with the newly acquired sample of data from the data source during the first and second clock cycles.

21. The non-transitory computer readable storage medium of claim 20, wherein generating an address is implemented using a shift register with a plurality of registers, wherein all but one register of the plurality of registers store a value of 0, and one register of the plurality of registers stores a 1.

* * * * *